United States Patent
Kim et al.

(10) Patent No.: US 6,687,282 B2
(45) Date of Patent: Feb. 3, 2004

(54) MICRO-LENS BUILT-IN VERTICAL CAVITY SURFACE EMITTING LASER

(75) Inventors: Seong-jin Kim, Gyeonggi-do (KR); Jae-hoon Lee, Gyeonggi-do (KR)

(73) Assignee: Samsung Electronics Co. Ltd., Suwon (KR)

(*) Notice: Subject to any disclaimer, the term of this patent is extended or adjusted under 35 U.S.C. 154(b) by 0 days.

(21) Appl. No.: 09/964,511

(22) Filed: Sep. 28, 2001

(65) Prior Publication Data

US 2002/0039376 A1 Apr. 4, 2002

(30) Foreign Application Priority Data

Oct. 4, 2000 (KR) ........................................ 2000-58114

(51) Int. Cl.[7] ................................................ H01S 3/08
(52) U.S. Cl. ........................................ 372/96; 101/108
(58) Field of Search ............................ 372/96, 101, 108

(56) References Cited

U.S. PATENT DOCUMENTS 6,134,195 A    10/2000   Kawamura ............... 369/44.22

2002/0150130 A1 * 10/2002 Coldren et al. ............... 372/20

FOREIGN PATENT DOCUMENTS

| JP | 62-112123  | 5/1987 |
| JP | 1-92706    | 4/1989 |
| JP | 11-110768  | 4/1999 |
| JP | 2000-244056| 9/2000 |

* cited by examiner

*Primary Examiner*—James Davie
(74) *Attorney, Agent, or Firm*—Staas & Halsey LLP

(57) ABSTRACT

A micro-lens built-in vertical cavity surface emitting laser (VCSEL). The micro-lens built-in VSEL includes a VCSEL portion emitting a laser beam in a direction in which semiconductor material layers are stacked; a micro-lens formed of a material capable of transmitting the laser beam emitted from the VCSEL portion; and an adjusting portion located between the VCSEL portion and the micro-lens adjusting a distance between the micro-lens and the VCSEL portion. When constructing an optical system with the VCSEL including the VCSEL portion, the adjusting portion, and the micro-lens, there is no need for a separate condensing lens and focusing position adjusting element. In addition, optical alignment structure is simple with increased freedom in arranging elements, and the number of parts required is sharply reduced.

32 Claims, 4 Drawing Sheets

MICRO-LENS BUILT-IN VERTICAL CAVITY SURFACE EMITTING LASER

CROSS-REFERENCE TO RELATED APPLICATIONS

This application claims the benefit of Korean Patent Application No. 2000-58114 filed on Oct. 4, 2000, in the Korean Industrial Property Office, the disclosure of which is incorporated herein by reference.

BACKGROUND OF THE INVENTION

1. Field of the Invention

The present invention relates to a vertical cavity surface emitting laser (VCSEL), and more particularly, to a micro-lens built-in VCSEL in which a micro-lens is formed at a light emitting surface of the VCSEL.

2. Description of the Related Art

In general, VCSELs emit a light beam in a direction of a semiconductor material stack, and thus it is easy to be optically combined with another optical element and to be assembled into an apparatus. In addition, the VCSELs can also be manufactured to have a two-dimensional array structure and can be widely applied as a light source in optical transmission systems for applications such as optical communications or interfacing using optical signals, and in optical recording/reproducing optical heads.

Referring to FIG. 1, a conventional VCSEL includes a substrate 10, a lower reflector 11, an active layer 12, a high-resistance region 13 and an upper reflector 14 which are sequentially stacked on the substrate 10, an upper electrode 16 formed on a portion of the upper reflector 14 excluding a window 18 through which a laser beam is emitted, and a lower electrode 17 formed underneath the substrate 10.

Each of the lower reflector 11 and the upper reflector 14 is a distributed Bragg reflector (DBR) which is formed by alternately stacking semiconductor material layers having different refractive indices, and having an opposite doping type. That is, the substrate 10 and the lower reflector 11 are doped with the same n-type impurities and the upper reflector 14 is doped with p-type impurities.

The high-resistance region 13 guides the flow of current applied through the upper and lower electrodes 16 and 17 into the center of the active layer 12. The active layer 12 is a region where light is generated by a combination of holes and electrons from the upper and lower reflectors 14 and 11, which is induced by current applied across the upper and lower electrodes 16 and 17.

Light generated in the active layer 12 is reflected repeatedly between the upper and lower reflectors 14 and 11 and only a light beam having a wavelength in accordance with the resonance condition remains, and is emitted through the window 18.

In the conventional VCSEL having the aforementioned structure, the laser beam emitted through the window 18 has a predetermined radiation angle. Thus, when such a conventional VCSEL is adopted as a light source to be used as, for example, an optical transmission system using an optical cable, a condensing lens condensing a diverging beam emitted from the VCSEL is required between the VCSEL and the input terminal of the optical cable, so as to efficiently couple the light beam emitted from the VCSEL to the optical cable.

In addition, for a maximal optical efficiency of coupling the light beam emitted from the VCSEL to the optical cable, an additional device adjusting the position of the focus of the light beam emitted from the VCSEL and condensed by the condensing lens in an alignment processor and/or an actual operating process is needed.

When an optical system is constructed with the conventional VCSEL, many components are required, and there is a need to align the lens with the central optical axis of the laser beam emitted from the VCSEL, making an optical alignment structure complicated.

SUMMARY OF THE INVENTION

Accordingly, it is an object of the present invention to provide a micro-lens built-in vertical cavity surface emitting laser (VCSEL) in which the position of a micro-lens formed at a light emitting surface of the VCSEL can be varied, so that there is no need for a separate condensing lens and a separate device to adjust the focusing position of the laser beam in constructing an optical system with the VCSEL.

Additional objects and advantages of the invention will be set forth in part in the description which follows and, in part, will be obvious from the description, or may be learned by practice of the invention.

The foregoing and other objects and advantages of the present invention are achieved by providing a micro-lens built-in vertical cavity surface emitting laser (VCSEL) comprising: a VCSEL portion emitting a laser beam in a direction in which semiconductor material layers are stacked; a micro-lens formed of a material capable of transmitting the laser beam emitted from the VCSEL portion; and an adjusting portion located between the VCSEL portion and the micro-lens adjusting a distance between the micro-lens and the VCSEL portion.

The above and other objects of the present invention are also achieved by providing that the adjusting portion comprises a piezoelectric material layer formed of piezoelectric polymer.

The above and other objects of the present invention are also achieved by providing that the VCSEL portion, the adjusting portion, and the micro-lens are each formed through separate processes and are then combined as a single unit by bonding.

The above and other objects of the present invention are also achieved by providing that the adjusting portion comprises a piezoelectric material layer formed of piezoelectric ceramic and the piezoelectric material layer has an aperture at its center through which a laser beam emitted from the VCSEL portion passes.

The above and other objects of the present invention are also achieved by providing that the VCSEL portion and the adjusting portion are formed as a single unit through continuous processes.

The above and other objects of the present invention are also achieved by providing that the piezoelectric material layer of the adjusting portion is formed as at least one layer.

The above and other objects of the present invention are also achieved by providing that the micro-lens built-in VCSEL further comprises an insulating layer between the VCSEL portion and the adjusting portion to electrically isolate the VCSEL portion and the adjusting portion.

BRIEF DESCRIPTION OF THE DRAWINGS

These and other objects and advantages of the present invention will become more apparent and more readily appreciated from the following description of the preferred embodiments, taken in conjunction with the accompany drawings in which.

DETAILED DESCRIPTION OF THE PREFERRED EMBODIMENTS

Figure 1:
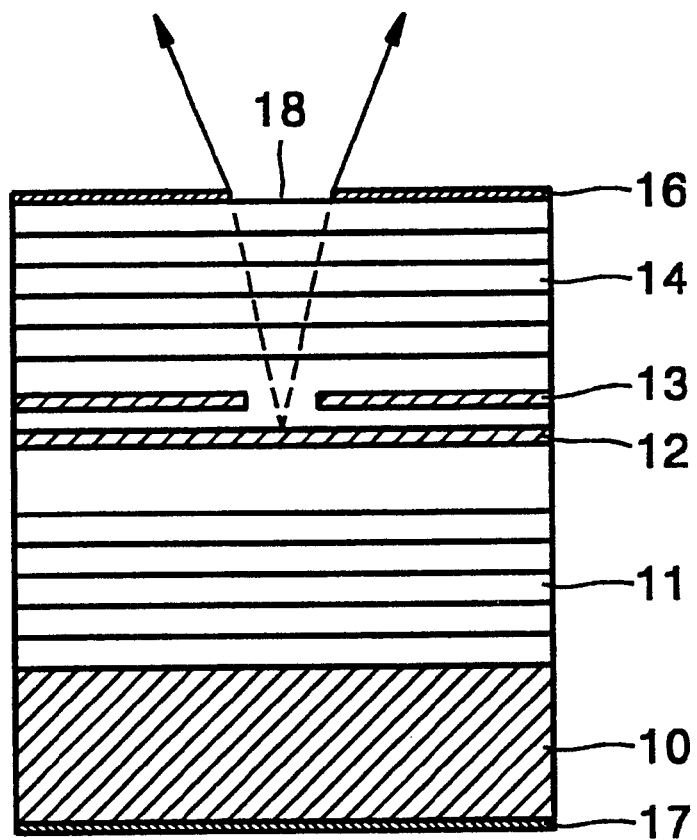
FIG. 1 shows an example of a conventional vertical cavity surface emitting laser (VCSEL)

Reference will now be made in detail to the embodiments of the present invention, examples of which are illustrated in the accompanying drawings, wherein like reference numerals refer to the like elements throughout. The embodiments are described below in order to explain the present invention by referring to the figures.

Figure 2:
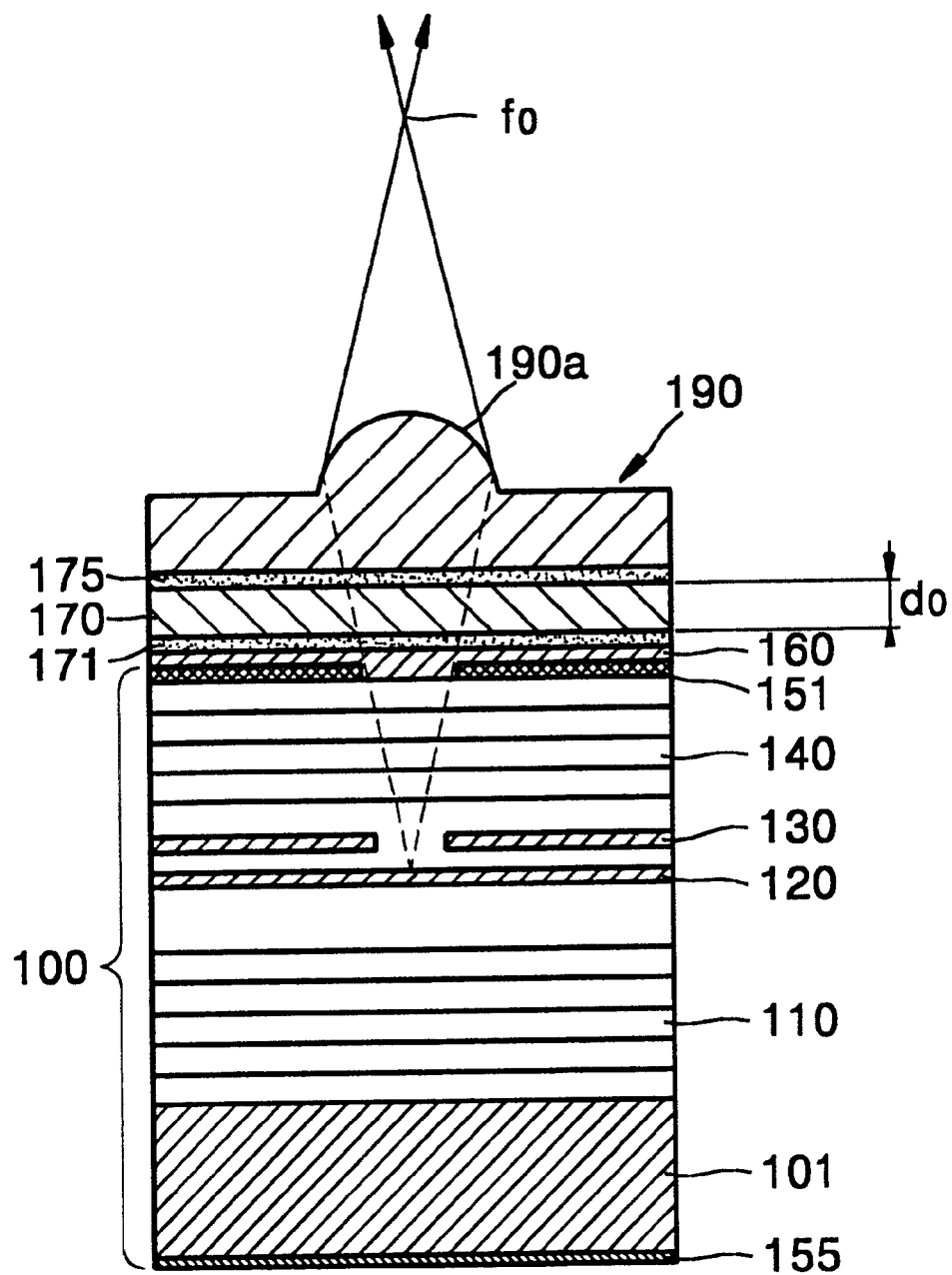
FIG. 2 shows an embodiment of a micro-lens built-in VCSEL according to the present invention.

Referring to FIG. 2, an embodiment of a micro-lens built-in vertical cavity surface emitting laser (VCSEL) according to the present invention includes a VCSEL portion 100 emitting a laser beam in a direction of the stack of semiconductor material layers, a micro-lens 190 formed of a transparent material capable of transmitting the laser beam from the VCSEL portion 100, and an adjusting portion 170 which is located between the VCSEL portion 100 and the micro-lens 190 to adjust the gap between the micro-lens 190 and the VCSEL portion 100.

The VCSEL portion 100 includes a substrate 101, a lower electrode 155 formed underneath the substrate 101, a lower reflector 110, an active layer 120, and an upper reflector 140 which are sequentially stacked on the substrate 101, and an upper electrode 151 formed on a portion of the upper reflector 140 excluding a region through which a laser beam is emitted.

The substrate 101 is formed of a semiconductor material such as, for example, n-doped gallium arsenide (GaAs), aluminum gallium arsenide (AlGaAs), indium arsenide (InAs), indium phosphide (InP), gallium phosphide (GaP), indium gallium phosphide (InGaP), indium gallium arsenide (InGaAs), or gallium phosphide (GaP).

Each of the lower reflector 110 and the upper reflector 140 is formed of alternating semiconductor compounds having different refractive indices. For example, the upper and lower reflectors 140 and 110 are formed by alternately stacking AlGaAs layers having different refractive indices.

For the structure as shown in FIG. 2, in which most of the generated laser beam is emitted through the upper reflector 140, the upper reflector 140 is formed to have a relatively lower reflectivity and the lower reflector 110 is formed to have a relatively higher reflectivity than the upper reflector 140. The reflectivity of reflectors 110 and 140 varies depending on the number of semiconductor compound layers deposited to form the same. Accordingly, by forming the upper reflector 140 with less stack layers than used to form the lower reflector 110, the reflectivity of the upper reflector 140 can become lower than that of the lower reflector 110. Here, if the substrate 101 is doped with n-type impurities, the lower reflector 110 may be doped with the same n-type impurities but the upper reflector 140 is doped with p-type impurities.

The upper and lower reflectors 140 and 110 induce a flow of electrons and holes by the current applied across the upper and lower electrodes 151 and 155, and reflect repeatedly a laser beam generated in the active layer 120 such that only a laser beam in accordance with the resonance condition is emitted through the upper reflector 140.

The active layer 120, a region where a laser beam is generated by energy transition due to the recombination of holes and electrons provided from the upper and lower reflectors 140 and 110, has a single or multiple quantum-well structure or super lattice structure. The active layer 120 may be formed of, for example, GaAs, AlGaAs, InGaAs, InGaP and/or AlGaAsP according to the wavelength of the output laser beam.

Meanwhile, it is preferable that a high-resistance region 130 guiding flow of current is further formed in a region of the upper reflector 140. The high-resistance region 130 may be formed by implantation of ions such as protons, or by selective oxidation. In the selective oxidation method, a pre-oxidative layer (not shown) is deposited in the middle of the upper reflector 140 and exposed in an oxidation atmosphere to form an oxidation insulating film as the high-resistance region.

In the VCSEL portion 100 having the configuration above, as a forward biased current is applied to the VCSEL through the upper and lower electrodes 151 and 155, the current is guided into the center region of the active layer 120 by the high-resistance region 130, and electrons and holes from the upper and lower reflectors 140 and 110 recombine in the active layer 120 to generate a laser beam. The generated light beam is reflected repeatedly between the upper and lower reflectors 140 and 110 and thus only a light beam having a particular wavelength (a desired laser beam to be emitted) in accordance with the resonance condition remains, is amplified, and is transmitted through the upper reflector 140.

The micro-lens 190 has a convex lens surface 190a through which a diverging beam emitted from the VCSEL portion 100 is condensed. The micro-lens 190 may be formed by diffusion-limited etching or spot melting in a flat member, which is transparent with respect to the laser beam emitted from the VCSEL portion 100.

The following principle is applied to the diffusion-limited etching. Specifically, an etch mask (not shown) having an opening is formed on a flat member and immersed in a chemical etching solution containing an appropriate concentration of etchant, such as bromine ($Br_2$), capable of inducing diffusion-limited etching to the flat member material, for a predetermined period of time. As a result, a portion of the flat member which is exposed through the opening of the etch mask is etched into a convex shape by a difference in spatial etching rate of the flat member caused by diffusion of the etchant, for example, $Br_2$, contained in the chemical etching solution.

When the diffusion-limited etching is used, the micro-lens 190 can be formed of a semiconductor material having a relatively wide bandgap to the wavelength of the laser beam oscillated in the VCSEL. A technique of manufacturing the micro-lens 190 with a semiconductor material using the diffusion-limited etching is disclosed in U.S. patent application Ser. No. 09/504,912 (Feb. 16, 2000) filed by the present applicant, entitled "Micro-lens, Combination Micro-lens and VCSEL, and Methods for Manufacturing the Same." Thus, a detailed description of the method for manufacturing the micro-lens 190 according to the present invention with a semiconductor material by the diffusion-limited etching will not be provided here.

The principle of the spot melting method is as follows. A predetermined portion of a flat member is irradiated by a high-energy laser beam spot such that the predetermined portion is melted. As the melted portion is slowly cooled, molecules of the melted portion are rearranged in such a direction that the surface energy is minimized, resulting in a convex surface. Here, if the cooling condition or the area of the flat member to be melted is adjusted, the micro-lens 190 having a desired curvature of the convex surface 190 can be formed.

The micro-lens 190 described above condenses a diverging beam emitted from the VCSEL 100 to focus a light spot onto a predetermined position. Thus, the focusing position of the beam emitted from the VCSEL 100 can be varied by adjusting the relative positions of the micro-lens 190 and the VCSEL portion 100 with the adjusting portion.

The adjusting portion includes a piezoelectric material layer 170 and a pair of drive electrodes 171 and 175 formed on the bottom and top of the piezoelectric material layer 170. In an embodiment of the present invention, it is preferable that the piezoelectric material layer 170 is formed of a piezoelectric polymer transmitting the beam emitted from the VCSEL portion 100, for example, of a polyvinyl acetate (PVA) based piezoelectric polymer. The piezoelectric material layer 170 formed of a piezoelectric polymer described above is advantageous in that it can displace the focusing position by a relatively large displacement and can be easily manufactured.

The piezoelectric material layer 170 has at least one layer. When the VCSEL according to the present invention is adopted in an optical system which needs a relatively small displacement of the focusing position, the piezoelectric material layer 170 may be formed as a single layer.

Meanwhile, when the VCSEL according to the present invention is adopted in an optical system which needs a relatively large displacement of the focusing position, preferably, the piezoelectric material layer 170 is formed as multiple layers. In this case, it is preferable that the multiple layers are electrically connected in parallel. The amount of displacement of the piezoelectric material layer 170 is proportional to the thickness of the same. If the piezoelectric material layer 170 is thick, there is a problem in that a high-applied voltage is needed to displace the piezoelectric material layer 170. However, when the piezoelectric material layer 170 is formed as multiple layers that are electrically connected in parallel, as in the VCSEL according to the present invention, the piezoelectric material layer 170 can be driven to obtain a relatively large distance due to the large thickness of the piezoelectric material layer with application of a relatively low driving voltage.

Meanwhile, when the piezoelectric material layer 170 is formed of a piezoelectric polymer which can transmit a laser beam, there is no need to form an aperture on an optical path along which the laser beam is emitted from the VCSEL portion 100. It is preferable that the pair of drive electrodes 171 and 175 are formed as transparent electrodes made of, for example, indium tin oxide (ITO), and are formed on the entire bottom and top surfaces of the piezoelectric material layer 170.

When the VCSEL includes the pair of drive electrodes 171 and 175 in the adjusting portion, as described above, it is preferable that an insulating layer 160 is further interposed between the lower drive electrode 171 of the adjusting portion and the upper electrode 151 of the VCSEL portion 100 to electrically isolate the VCSEL portion 100 and the adjusting portion from one another.

Alternatively, the VCSEL may have a structure in which the adjusting portion and the VCSEL portion 100 use a common electrode. In this case, no insulating layer 160 is needed.

In this embodiment of the micro-lens built-in VCSEL according to the present invention having the structure described above, the VCSEL portion 100, the adjusting portion, and the micro-lens 190 are formed through separate processes and are combined as a single unit by bonding. Alternatively, the VCSEL portion 100, the adjusting portion, and the micro-lens 190 can be formed through continuous processes as a single unit.

The embodiment of the micro-lens built-in VCSEL according to the present invention having the structure described above operates as follows.

Figure 3:
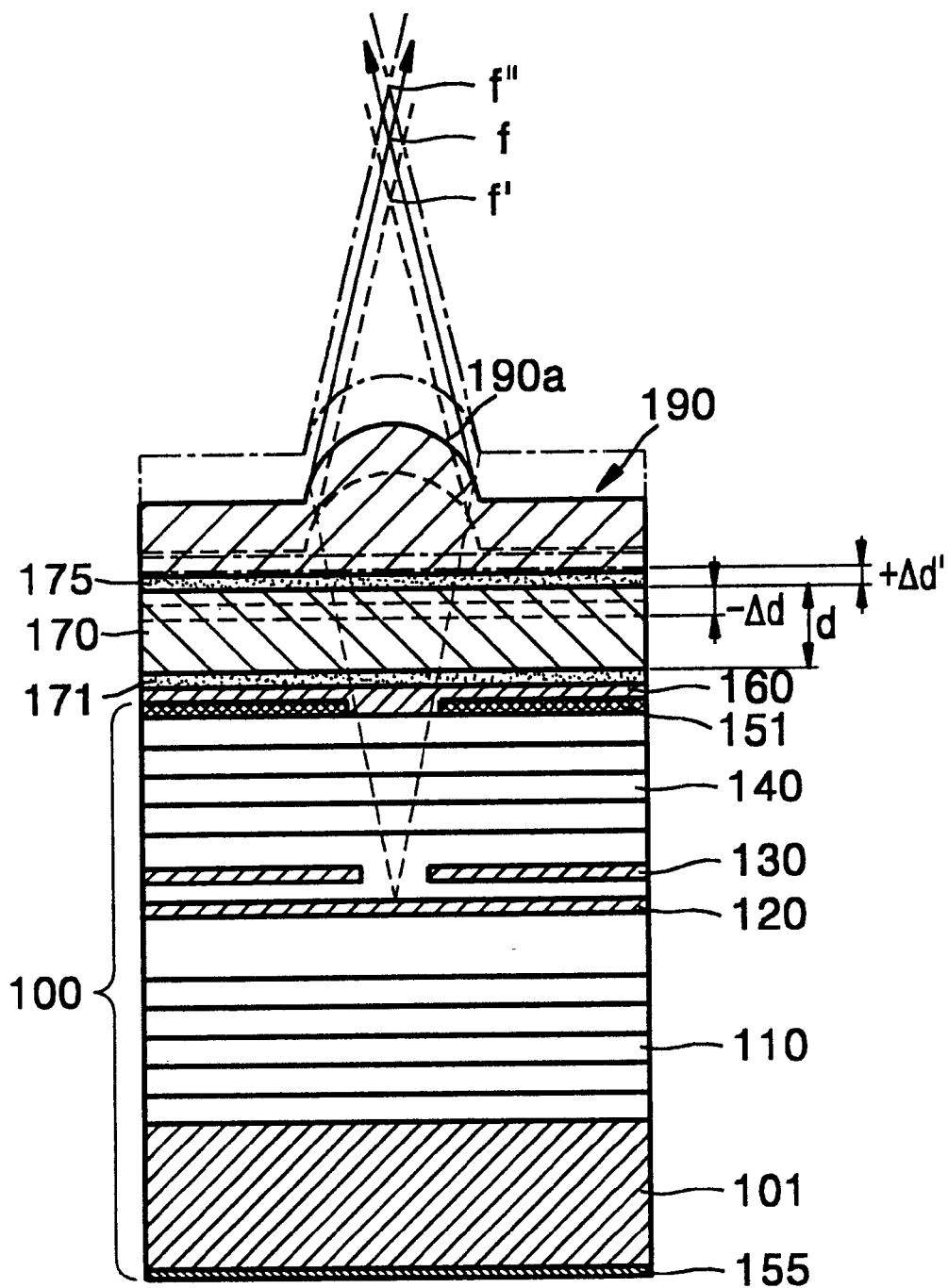
FIG. 3 shows adjustment of the focusing position of a laser beam by an adjusting portion in the micro-lens built-in VCSEL of FIG. 2.

Assuming that, in a state where no voltage is applied, the thickness of the piezoelectric material layer 170 is $d_0$ and an initial focusing position is $f_0$, as shown in FIG. 2, as a predetermined amount of voltage (V) is applied to the pair of drive electrodes 171 and 175, the thickness of the piezoelectric material layer 170 increases from $d_0$ to d, as shown in FIG. 3, and the focusing position of a laser beam emitted from the VCSEL portion 100 and focused by the micro-lens 190 is shifted from $f_0$ to f.

When the thickness of the piezoelectric material layer 170 decreases by $\Delta d$ by reducing the applied voltage (V), also shown in FIG. 3, the laser beam emitted from the VCSEL portion 100 is focused at a focusing position f', which is closer than the focusing position f.

In contrast, when the thickness of the piezoelectric material layer 170 increases by $\Delta d$ by increasing the applied voltage (V), the laser beam emitted from the VCSEL portion 100 is focused at a focusing position f" which is farther away than the focusing position f.

When the application of the voltage stops, the thickness of the piezoelectric material layer 170 restores to its original thickness $d_0$, and the laser beam emitted from the VCSEL portion 100 is once again focused at the focusing position $f_0$.

Figure 4:
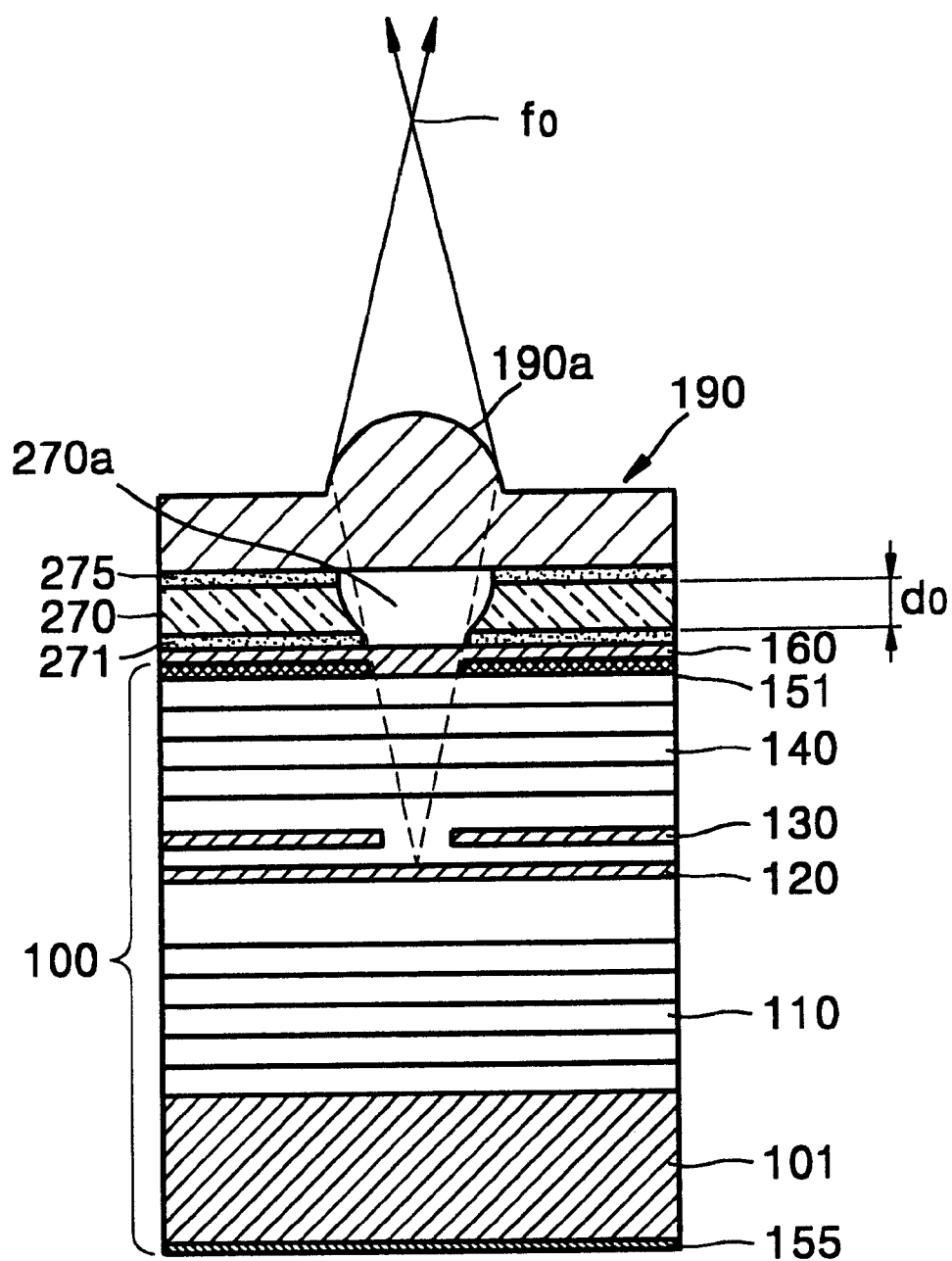
FIG. 4 shows another embodiment of the micro-lens built-in VCSEL according to the present invention.

FIG. 4 shows another embodiment of the micro-lens built-in VCSEL according to the present invention. In FIG. 4, the same reference numerals as those of FIG. 2 represent elements having substantially the same functions as corresponding elements of FIG. 2. In the present embodiment, the adjusting portion includes a piezoelectric material layer 270 formed of piezoelectric ceramic, and a pair of drive electrodes 271 and 275 formed on the bottom and top of the piezoelectric material layer 270.

In this structure, since piezoelectric ceramic is opaque with respect to a laser beam, the piezoelectric material layer 270 has an aperture 270a at the center thereof through which the laser beam emitted from the VCSEL portion 100 is emitted. The pair of drive electrodes 271 and 275 may be formed on a portion of the bottom and top of the piezoelectric material layer 270 excluding the aperture 270a.

The piezoelectric material layer 270 formed of piezoelectric ceramic, as described above, has an advantage in that it has a relatively fast response characteristic.

Like the piezoelectric material layer 170 of the VCSEL according to the previous embodiment of the present invention, the piezoelectric material layer 270 has at least one layer. When the VCSEL according to this embodiment of the present invention is adopted in an optical system which needs a relatively small displacement of the focusing position, the piezoelectric material layer 270 may be formed as a single layer. Meanwhile, when the VCSEL according to this embodiment of the present invention is adopted in an optical system which needs a relatively large displacement of the focusing position, preferably, the piezoelectric material layer 270 is formed as multiple layers. In this case, it is preferable that the multiple layers are electrically connected in parallel such that a thick piezoelectric material layer 270 having the multiple layers can be displaced with application of a relatively low voltage.

As in the previous embodiment of the VCSEL according to the present invention, the adjusting portion and the VCSEL portion 100 according to this embodiment may be formed as a structure using a common electrode. In this case, no insulating layer 160 is needed for the VCSEL.

In the micro-lens built-in VCSEL according to this embodiment having the structure described above, the VCSEL portions 100 and the adjusting portion can be formed through continuous processes as a single unit, due to the characteristics of the piezoelectric ceramic. In this case, the micro lens 190 can be formed as a single unit along with the VCSEL portion 100 and the adjusting portion through continuous processes. Alternatively, the micro-lens 190 may be formed as a separate unit and then combined with the adjusting portion as a single unit by bonding.

Like the VCSEL according to the previous embodiment described with reference to FIGS. 2 and 3, in the micro-lens built-in VCSEL according to this embodiment having the structure described above, the focusing position of the laser beam emitted from the VCSEL portion 100 and condensed by the micro-lens can be adjusted.

In the VCSELs according to the embodiments described above with reference to FIGS. 2 through 4, the adjusting portion and the micro-lens 190 are formed as a single unit along with the VCSEL portion 100, so that a diverging beam emitted from the VCSEL portion 100 can be changed into a condensing beam and the focusing position of the condensing beam can be adjusted without a separate adjusting element.

Thus, when a micro-lens built-in VCSEL according to the present invention is adopted in an optical communications system using an optical fiber, a sufficient optical coupling effect can be obtained without a separate ball lens (not shown) between the VCSEL and the optical fiber. In addition, optical coupling efficiency of the laser beam emitted from the VCSEL and the optical cable can be maximized by adjusting the relative position of the micro-lens 190 with respect to the VCSEL portion 100 by the combined adjusting portion. Thus, optical axis alignment structure is simple, and the number of parts required is markedly reduced.

When a micro-lens built-in VCSEL according to the present invention is adopted at an interface to transmit and receive an optical signal through free space, no separate condensing lens is needed and the focusing position can be adjusted. Therefore, the degree of freedom of distance between light transmitting and receiving portions increases. Thus, the optical structure is simple and optical alignment is easy. Furthermore, the VCSEL and/or a light detecting element can be arranged in arrays with compactness.

Although the VCSEL according to the present invention is described as emitting a condensed beam, the present invention is not limited to this structure, and the VCSEL can be designed such that it emits a parallel beam. This parallel beam emitting VCSEL can be realized by making the micro-lens 190 according to the present invention to have an appropriate curvature. The parallel beam emitting VCSEL according to the present invention can be adopted in an optical system, such as an optical head, which needs a collimated parallel beam. In this case, unlike a conventional VCSEL, there is no need for a collimating lens.

Although the micro-lens 190 of the VCSEL according to the present invention is described and illustrated as having a convex surface formed by diffusion-limited etching or spot melting, the present invention is not limited to this micro-lens, and the micro-lens 190 may alternatively have a concave surface. In this case, the micro-lens 190 having a concave surface is formed by, for example, isotropic etching. As is well known in the semiconductor field, isotropic etching refers to a technique applied when a predetermined portion of an amorphous plate member formed of an amorphous material is opened and etched, wherein the opened portion is isotropically etched.

As described above, when the VCSEL according to the present invention has the micro-lens having a concave surface, a diverging beam emitted from the VCSEL portion 100 may diverge at greater angles. The divergence angle of the beam can be varied by adjusting the position of the micro-lens 190 with the adjusting portion. Thus, a VCSEL according to the present invention including the micro-lens 190 having a concave surface can be efficiently adopted in an optical system which needs a relatively large beam spot within a short distance from a light source.

Even when the wavelength of a laser beam emitted from the VCSEL varies according to output power and/or temperature variations, the VCSEL according to the present invention emits an optimal parallel beam, condensed beam, or diverging beam by adjusting the relative distances of the VCSEL portion 100 and the micro-lens 190 with the adjusting portion.

The VCSEL according to the present invention, as described above, includes the VCSEL portion, the adjusting portion, and the micro-lens, and therefore there is no need for a separate condensing lens and focusing position adjusting element when constructing an optical system with the VCSEL.

When an optical system is constructed using the VCSEL according to the present invention, optical alignment structure is simple with increased freedom in arranging elements, and the number of parts required is sharply reduced.

Although a few embodiments of the present invention have been shown and described, it will be appreciated by those skilled in the art that changes may be made in these embodiments without departing from the principles and spirit of the invention, the scope of which is defined in the appended claims and their equivalents.

What is claimed is:

1. A micro-lens built-in vertical cavity surface emitting laser (VCSEL) comprising:
   a VCSEL portion emitting a laser beam in a direction in which semiconductor material layers are stacked;
   a micro-lens formed of a material to transmit the laser beam emitted from the VCSEL portion; and
   an adjusting portion located between the VCSEL portion and the micro-lens and adjusting a distance between the micro-lens and the VCSEL portion.

2. The micro-lens built-in VCSEL of claim 1, wherein the adjusting portion comprises a piezoelectric material layer formed of piezoelectric polymer.

3. The micro-lens built-in VCSEL of claim 2, wherein the VCSEL portion, the adjusting portion, and the micro-lens are each formed through separate process and are then combined as a single unit by bonding.

4. The micro-lens built-in VCSEL of claim 1, wherein the adjusting portion comprises a piezoelectric material layer formed of piezoelectric ceramic and the piezoelectric material layer has an aperture at a center thereof through which a laser beam emitted from the VCSEL portion passes.

5. The micro-lens built-in VCSEL of claim 4, wherein the VCSEL portion and the adjusting portion are formed as a single unit through continuous processes.

6. The micro-lens built-in VCSEL of claim 5, wherein the micro-lens is combined with the adjusting portion by bonding.

7. The micro-lens built-in VCSEL of claim 5, wherein the micro-lens is formed as a single unit along with the VCSEL portion and adjusting portion through continuous processes.

8. The micro-lens built-in VCSEL of claim 2, wherein the piezoelectric material layer of the adjusting portion is formed as at least one layer.

9. The micro-lens built-in VCSEL of claim 4, wherein the piezoelectric material layer of the adjusting portion is formed as at least one layer.

10. The micro-lens built-in VCSEL of claim 1, further comprising an insulating layer between the VCSEL portion and the adjusting portion to electrically isolate the VCSEL portion and the adjusting portion.

11. The micro-lens built-in VCSEL of claim 1, wherein the micro-lens is formed in a plate member which is transparent with respect to the laser beam emitted from the VCSEL portion, by diffusion-limited etching, spot melting, or isotropic etching.

12. The micro-lens built-in VCSEL of claim 2, wherein said piezoelectric material is polyvinyl acetate (PVA) based.

13. The micro-lens built-in VCSEL of claim 8, wherein said piezoelectric material of the adjusting portion is formed as multiple layers.

14. The micro-lens built-in VCSEL of claim 13, wherein said multiple layers are electrically connected in parallel.

15. The micro-lens built-in VCSEL of claim 2, wherein said adjusting portion further comprises a pair of drive electrodes positioned at opposite sides of said piezoelectric material.

16. The micro-lens built-in VCSEL of claim 11, wherein said micro-lens is shaped to have a convex surface.

17. The micro-lens built-in VCSEL of claim 11, wherein said micro-lens is shaped to have a concave surface.

18. The micro-lens built-in VCSEL of claim 1, wherein said VCSEL portion comprises an upper VCSEL electrode and a lower VCSEL electrode each having a current applied thereto.

19. The micro-lens built-in VCSEL of claim 18, wherein said adjusting portion comprises an upper drive electrode and a lower drive electrode positioned at the upper and lower sides of said adjusting portion, respectively.

20. The micro-lens built-in VCSEL of claim 1, wherein said adjusting portion and said VCSEL portion are formed to use a common electrode.

21. The micro-lens built-in VCSEL of claim 15, wherein the pair of drive electrodes are transparent and formed on the entire sides of said piezoelectric material.

22. The micro-lens built-in VCSEL of claim 19, further comprising an insulating member interposed between said lower drive electrode and said upper VCSEL electrode.

23. The micro-lens built-in VCSEL of claim 1, wherein the VCSEL portion comprises:
a lower electrode;
a substrate;
a lower reflector;
an active layer;
a high-resistance region; and
an upper reflector;
wherein the lower electrode, the substrate, the lower reflector, the active layer, high-resistance region and the upper reflector are sequentially stacked, and the upper reflector has a lower reflectivity than that of the lower reflector.

24. The micro-lens built-in VCSEL of claim 23, wherein each of the upper and lower reflectors comprise a plurality of stack layers, wherein the upper reflector has less of the stack layers than the lower reflector.

25. The micro-lens built-in VCSEL of claim 23, wherein the upper and lower reflectors are oppositely doped.

26. The micro-lens built-in VCSEL of claim 15, wherein the pair of electrodes are transparent.

27. The micro-lens built-in VCSEL of claim 26, wherein the pair of electrodes are made of indium tin oxide.

28. The micro-lens built-in VCSEL of claim 15, wherein the pair of electrodes are respectively formed on entire top and bottom surfaces of the piezoelectric material layer.

29. The micro-lens built-in VCSEL of claim 1, wherein the micro-lens emits the laser beam as a converging beam.

30. The micro-lens built-in VCSEL of claim 1, wherein the micro-lens emits the laser beam as a parallel beam.

31. A micro-lens built-in vertical cavity surface emitting laser (VCSEL), comprising:
a VCSEL portion emitting a laser beam;
a micro-lens; and
an adjusting portion located between the VCSEL portion and the micro-lens, which adjusts a focus of the micro-lens for the laser beam.

32. The micro-lens built-in VCSEL of claim 31, wherein:
the VCSEL portion emits the laser beam as a diverging beam; and
the adjusting portion adjusts a distance between the VCSEL portion and the micro-lens so that the micro-lens condenses the diverging beam to a parallel or converging beam.

* * * * *